(12) United States Patent
Tagle

(10) Patent No.: US 11,953,560 B2
(45) Date of Patent: Apr. 9, 2024

(54) WIRING HARNESS TESTING ASSEMBLY

(71) Applicant: Bobby Tagle, Midland, TX (US)

(72) Inventor: Bobby Tagle, Midland, TX (US)

( * ) Notice: Subject to any disclaimer, the term of this patent is extended or adjusted under 35 U.S.C. 154(b) by 75 days.

(21) Appl. No.: 17/743,050

(22) Filed: May 12, 2022

(65) Prior Publication Data

US 2023/0366954 A1 Nov. 16, 2023

(51) Int. Cl.
*G01R 31/58* (2020.01)
*G01R 31/54* (2020.01)
*H01R 13/717* (2006.01)
*G01R 31/00* (2006.01)

(52) U.S. Cl.
CPC ............. *G01R 31/58* (2020.01); *G01R 31/54* (2020.01); *H01R 13/7175* (2013.01); *G01R 31/006* (2013.01)

(58) Field of Classification Search
CPC ........ G01R 31/58; G01R 31/50; G01R 31/52; G01R 31/54; G01R 31/006; H01R 13/7175
See application file for complete search history.

(56) References Cited

U.S. PATENT DOCUMENTS

| | | | | |
|---|---|---|---|---|
| 3,836,843 A | * | 9/1974 | Yonce | G01R 31/54 324/504 |
| 3,904,958 A | * | 9/1975 | Gartland, Jr. | G01R 19/145 324/508 |
| 3,944,915 A | * | 3/1976 | Yonce | H01R 13/7177 324/504 |
| 4,166,242 A | * | 8/1979 | Spiteri | G01R 19/145 324/504 |
| 4,249,125 A | * | 2/1981 | Carver | G01R 19/145 324/504 |
| 4,280,092 A | * | 7/1981 | Wells, Jr. | G01R 31/3277 324/508 |
| 4,547,722 A | * | 10/1985 | Sarlo | G01R 31/44 324/504 |
| 4,926,330 A | | 5/1990 | Abe | |
| 4,959,792 A | * | 9/1990 | Sullivan | G01R 31/58 324/555 |
| 5,285,163 A | * | 2/1994 | Liotta | G01R 31/58 324/508 |
| 5,361,026 A | * | 11/1994 | Pruehs | G01R 35/00 324/133 |
| 5,414,362 A | * | 5/1995 | Gramling | G01R 31/006 324/504 |
| 5,604,439 A | * | 2/1997 | Walkington | G01R 31/44 324/504 |

(Continued)

*Primary Examiner* — Patrick Assouad
*Assistant Examiner* — Demetrius R Pretlow

(57) ABSTRACT

A wiring harness testing assembly for testing a wiring harness for wiring faults includes a puck that is positionable on a female coupler of a wiring harness on a semi-truck and the puck is foraminous. A plurality of testing lights is provided and each of the testing lights has a contact that is insertable through a respective foramen in the puck to electrically engage the female coupler of the wiring harness when the puck is positioned on the female coupler. Furthermore, respective ones of the testing lights are turned on when the contact on the respective testing light completes a circuit with a respective wire on the wiring harness thereby facilitating the respective wire to be tested for continuity.

6 Claims, 5 Drawing Sheets

(56) References Cited

U.S. PATENT DOCUMENTS

| | | | | |
|---|---|---|---|---|
| 5,831,436 | A | * | 11/1998 | Borland ................. G01R 31/67 |
| | | | | 324/504 |
| 5,936,407 | A | * | 8/1999 | Borland ................. G01R 31/58 |
| | | | | 324/504 |
| 6,259,170 | B1 | * | 7/2001 | Limoge ................. B60Q 1/305 |
| | | | | 439/490 |
| 6,477,478 | B1 | | 11/2002 | Jones |
| 6,535,113 | B1 | * | 3/2003 | Gravolin ............. B60Q 11/007 |
| | | | | 340/687 |
| 7,209,850 | B2 | | 4/2007 | Brott |
| 7,368,919 | B2 | | 5/2008 | Gervais |
| 9,069,026 | B1 | * | 6/2015 | Rutkowsky ............ G01R 31/44 |
| 9,783,099 | B1 | * | 10/2017 | Delucco ............. H01R 13/7175 |
| 10,837,994 | B2 | | 11/2020 | Whisenand |
| 2004/0005811 | A1 | * | 1/2004 | Gravolin ............ H01R 13/6658 |
| | | | | 439/503 |
| 2009/0212964 | A1 | * | 8/2009 | Hibma ............. G01R 19/16547 |
| | | | | 340/657 |
| 2010/0010758 | A1 | * | 1/2010 | Kinahan ............ G01R 31/3025 |
| | | | | 702/58 |
| 2012/0156896 | A1 | * | 6/2012 | Corless ................ H01R 13/447 |
| | | | | 439/35 |
| 2015/0129304 | A1 | * | 5/2015 | Ramunno ........... B60R 16/0207 |
| | | | | 174/72 A |
| 2017/0194746 | A1 | * | 7/2017 | Freer .................... H01R 13/652 |
| 2020/0044398 | A1 | * | 2/2020 | Ireland ............... H01R 13/7175 |
| 2021/0223333 | A1 | * | 7/2021 | Schmier, II ............ G01R 31/69 |

\* cited by examiner

US 11,953,560 B2

WIRING HARNESS TESTING ASSEMBLY

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to testing devices and more particularly pertains to a new testing device for testing a wiring harness for wiring faults. The device includes a foraminous puck and a plurality of testing lights that can each be inserted through the puck. Each of the testing lights has an elongated contact which extends into a respective socket in the female coupler when the puck is positioned on the female coupler. Each testing light is turned on when the wire associated with the respective socket is conducting electricity for testing the entire wiring harness for wiring faults.

(2) Description of Related Art Including Information Disclosed Under 37 CFR 1.97 and 1.98

The prior art relates to testing devices including a digital testing device for testing individual contacts of a motor vehicle computer. The prior art discloses a method of testing automotive circuits that includes a base station and at least two handsets. The prior art discloses a method for testing an installed wiring harness that includes providing a signal source at a first node of a wiring harness, a measurement testing module placed at a second node of a wiring harness and a central management module to control the testing module. The prior art discloses an electrical test device that includes a power supply, a test probe and a spectrum analysis block.

BRIEF SUMMARY OF THE INVENTION

An embodiment of the disclosure meets the needs presented above by generally comprising a puck that is positionable on a female coupler of a wiring harness on a semi-truck and the puck is foraminous. A plurality of testing lights is provided and each of the testing lights has a contact that is insertable through a respective foramen in the puck to electrically engage the female coupler of the wiring harness when the puck is positioned on the female coupler. Furthermore, respective ones of the testing lights are turned on when the contact on the respective testing light completes a circuit with a respective wire on the wiring harness thereby facilitating the respective wire to be tested for continuity.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
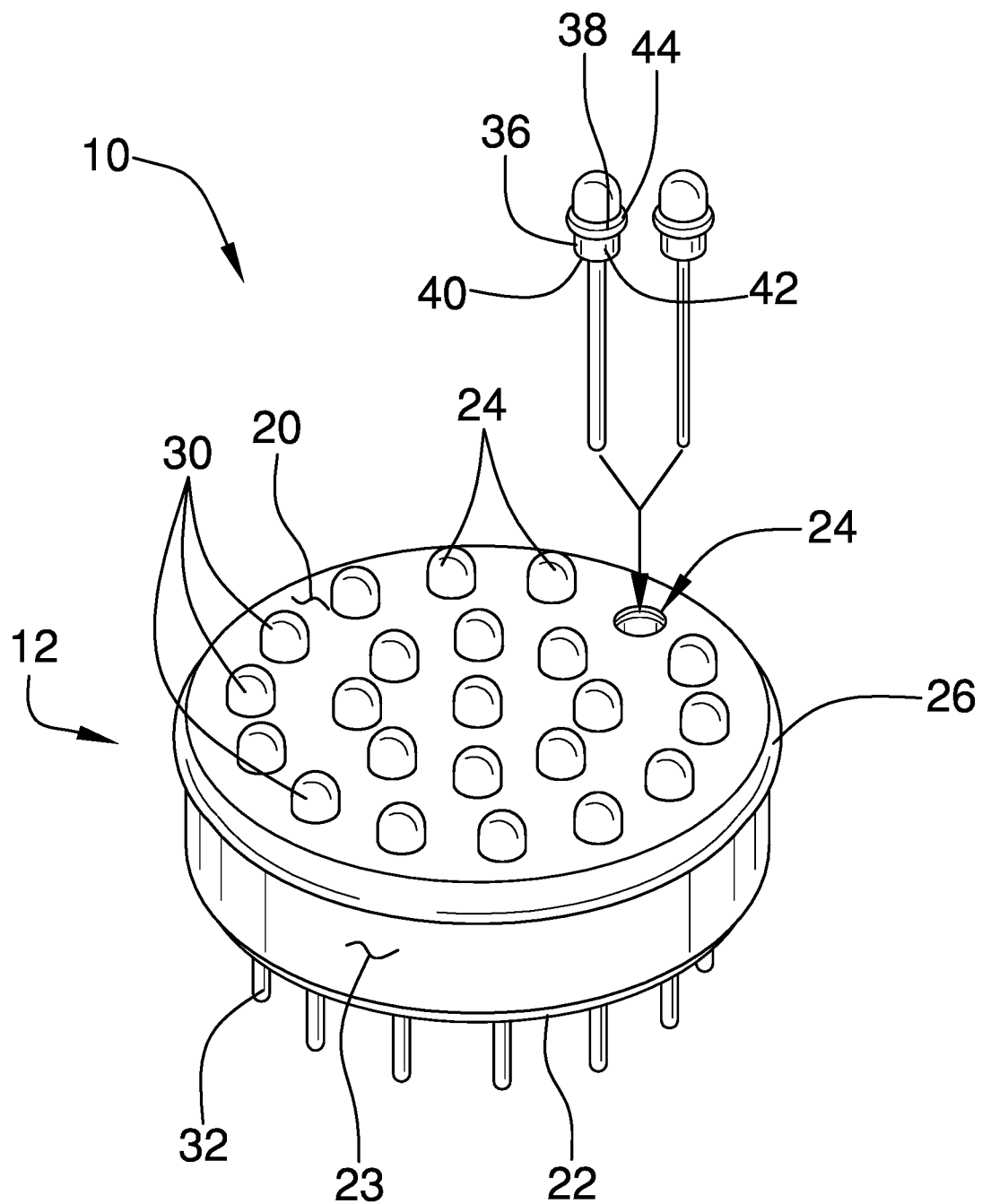
FIG. 1 is a top perspective view of a wiring harness testing assembly according to an embodiment of the disclosure.
Figure 2:
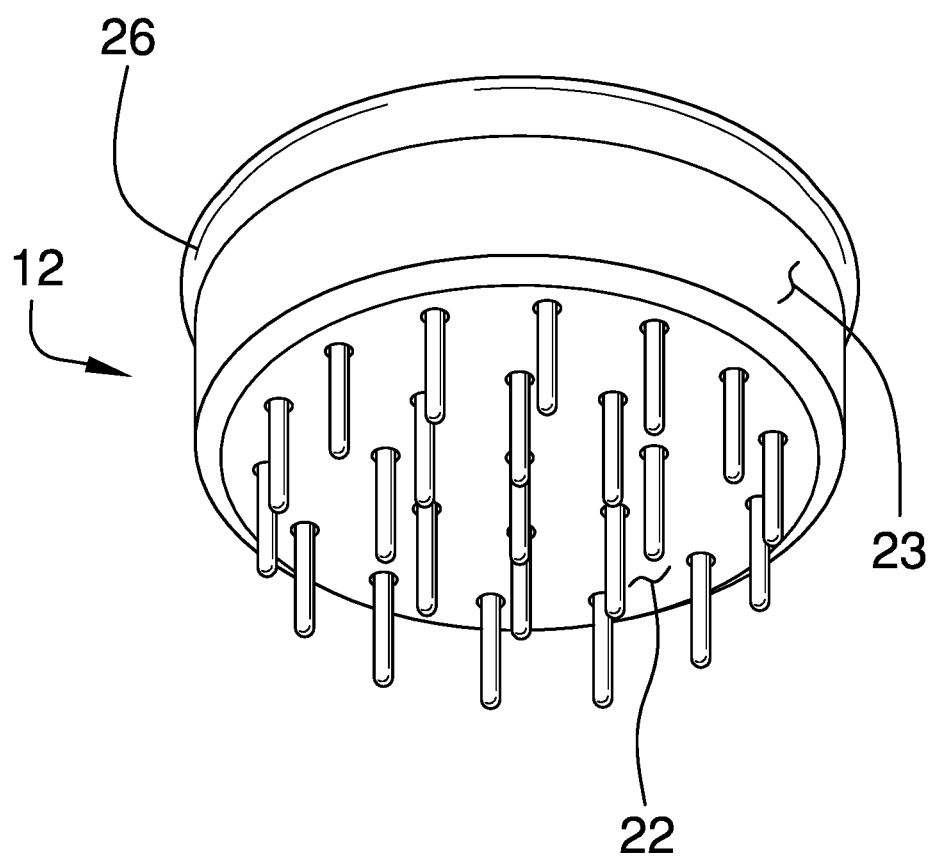
FIG. 2 is a bottom perspective view of an embodiment of the disclosure.

With reference now to the drawings, and in particular to FIGS. 1 through 5 thereof, a new testing device embodying the principles and concepts of an embodiment of the disclosure and generally designated by the reference numeral 10 will be described.

As best illustrated in FIGS. 1 through 5, the wiring harness testing assembly 10 generally comprises a puck 12 that is positionable on a female coupler 14 of a wiring harness 16 on a semi-truck 18. The wiring harness 16 may be a wiring harness of an ignition computer of the semi-truck 18 and the puck 12 is foraminous. Furthermore, the puck 12 is comprised of an electrically insulating material such that the puck 12 does not electrically communicate with the wiring harness 16. The puck 12 has a top surface 20, a bottom surface 22 and a perimeter surface 23 extending between the top surface 20 and the bottom surface 22, and the puck 12 has a plurality of holes 24 each extending through the top surface 20 and the bottom surface 22 thereby facilitating the puck 12 to be foraminous. The holes 24 are spaced apart from each other and are strategically distributed on the puck 12 such that each of the holes 24 is aligned with a respective one of a plurality of sockets 26 in the female coupler 14 when the puck 12 is positioned on the female coupler 14.

The puck 12 has a lip 26 extending outwardly from the perimeter surface 23 of the puck 12, and the lip 26 extends around a full circumference of the perimeter surface 23. The lip 26 is aligned with the top surface 20 of the puck 12 and the lip 26 abuts an upper edge 28 of the female coupler 14 when the puck 12 is positioned on the female coupler 14. Additionally, an intersection between the perimeter surface 23 and the bottom surface 22 is chamfered.

A plurality of testing lights 30 is provided and each of the testing lights 30 has a contact 32. The contact 32 on each of the testing lights 30 is insertable through respective foramen in the puck 12. In this way the contact 32 on each of the testing lights 30 can electrically engage the female coupler 14 of the wiring harness 16 when the puck 12 is positioned on the female coupler 14. Furthermore, respective ones of the testing lights 30 are turned on when the contact 32 on the respective testing light 30 completes a circuit with a respective wire 34 on the wiring harness 16 thereby facilitating the respective wire 34 to be tested for continuity. In this way the entire wiring harness 16 can be quickly and efficiently diagnosed for electrical problems.

Each of the testing lights 30 comprises a cylinder 36 that has an upper end 38, a lower end 40 and an exterior surface 42 extending between the upper end 38 and the lower end 40. The cylinder 36 has a ledge 44 extending outwardly from the exterior surface 42 and the ledge 44 is aligned with the upper end 38. Furthermore, the cylinder 36 extends into a respective one of the holes 24 in the puck 12 having the ledge 44 resting upon the top surface 20 of the puck 12. Each of the testing lights 30 includes a light emitter 46 that is attached to the upper end 38 of the cylinder 36 such that the light emitter 46 is exposed when the cylinder 36 is inserted into the respective hole. The light emitter 46 may comprise a light emitting diode or the like and the light emitter 46 may include a lens that surrounds the light emitting diode.

Each of the testing lights 30 includes a rod 48 that has a top end 50 and a bottom end 52. The rod 48 extends through the lower end 40 of the cylinder 36 such that the top end 50 is electrically coupled to the light emitter 46 such that the rod 48 defines the contact 32. Additionally, the rod 48 is elongated between the top end 50 and the bottom end 52 thereby facilitating the rod 48 to extend substantially into a respective socket 54 in the female coupler 14. The rod 48 is comprised of an electrically conductive material thereby facilitating the light emitter 46 to be in electrical communication with the wire 34 associated with the respective socket 54. As is most clearly shown in FIG. 1, the rod 48 associated with plurality of testing lights 30 may be manufactured in a variety of gauges thereby facilitating the rod 48 to accommodate different sizes of sockets 26 in the wiring harness 16.

Figure 3:
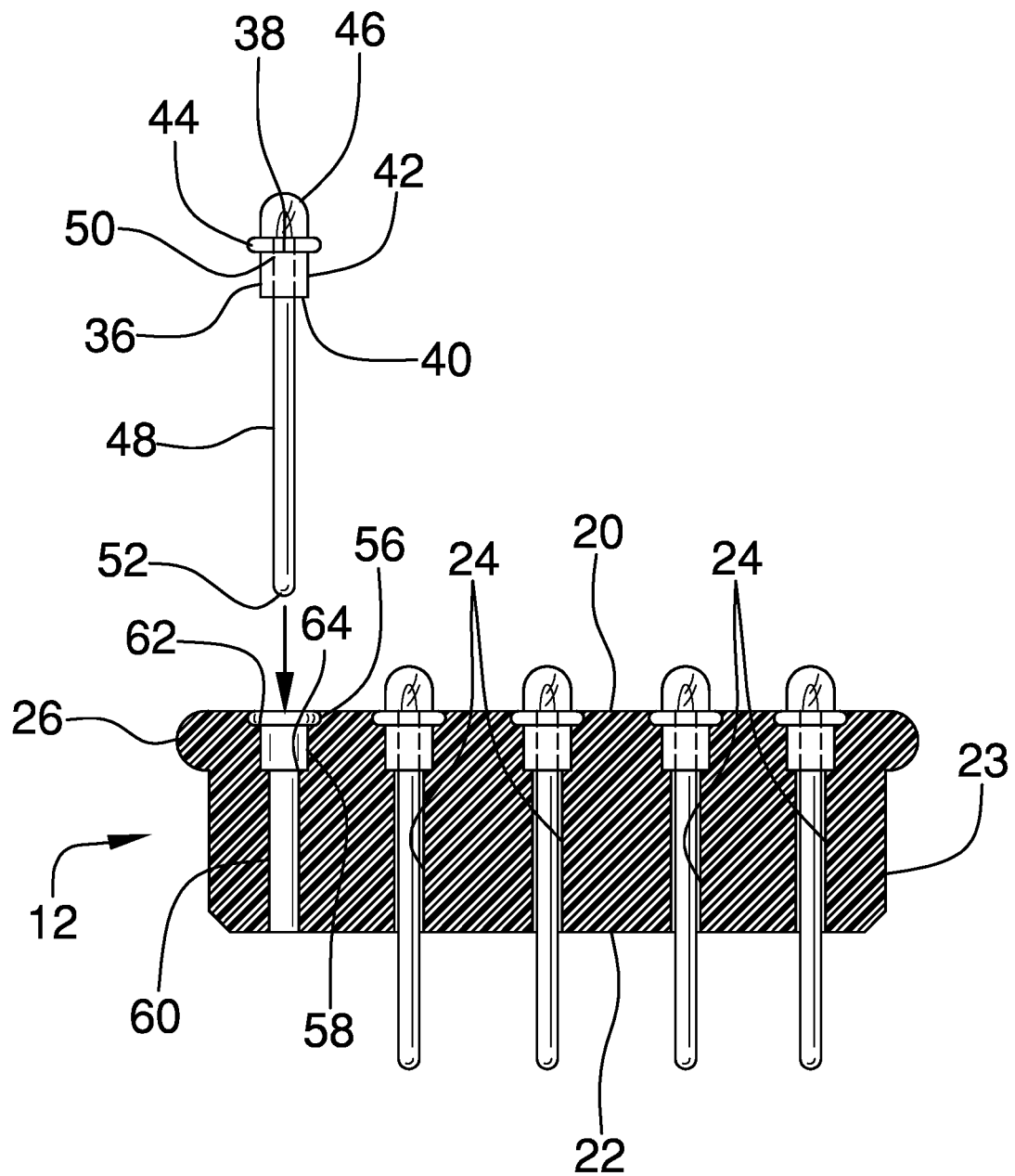
FIG. 3 is a front cut-away view of an embodiment of the disclosure.
Figure 4:
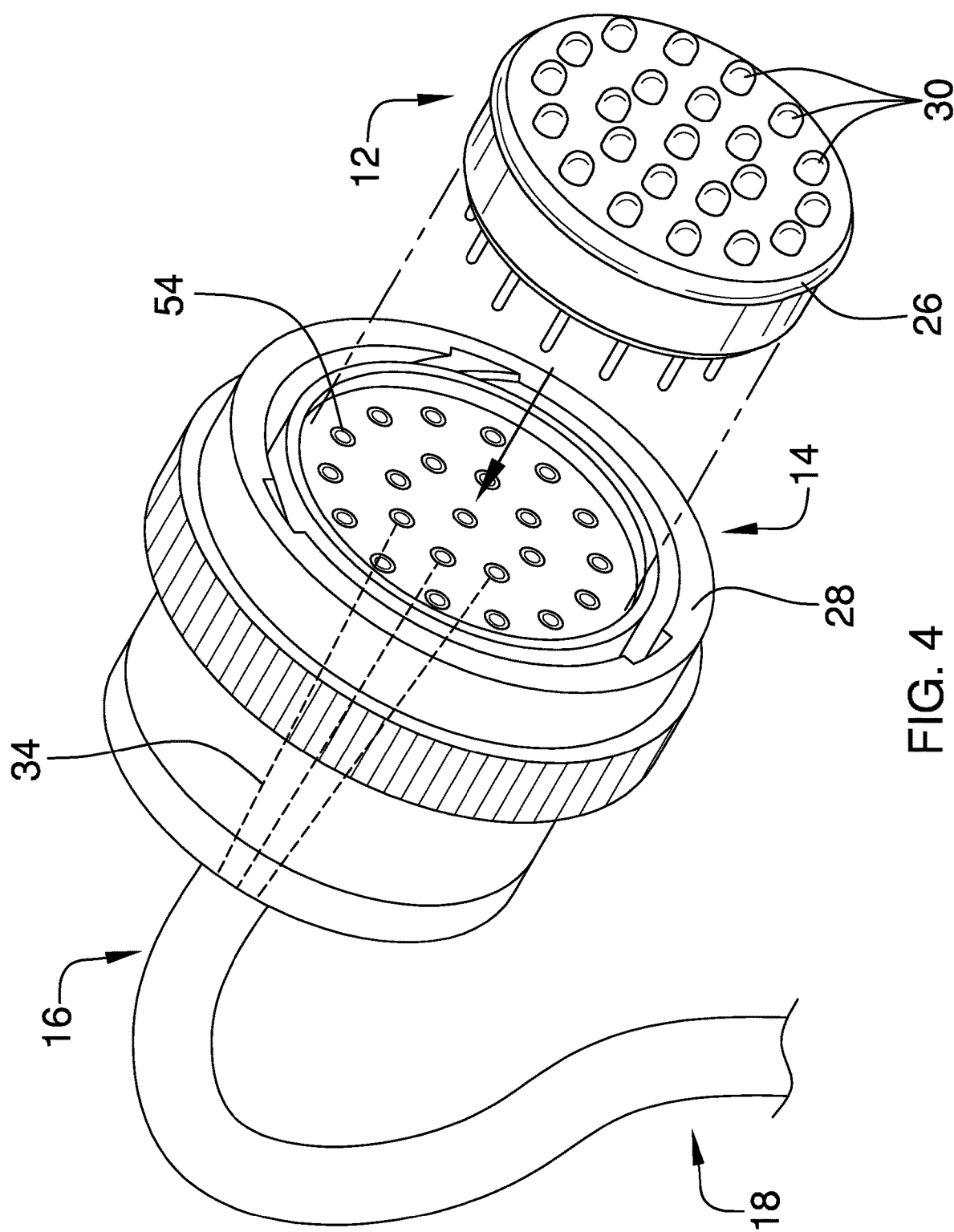
FIG. 4 is a perspective in-use view of an embodiment of the disclosure showing a puck being seated onto a female coupler of a wiring harness.
Figure 5:
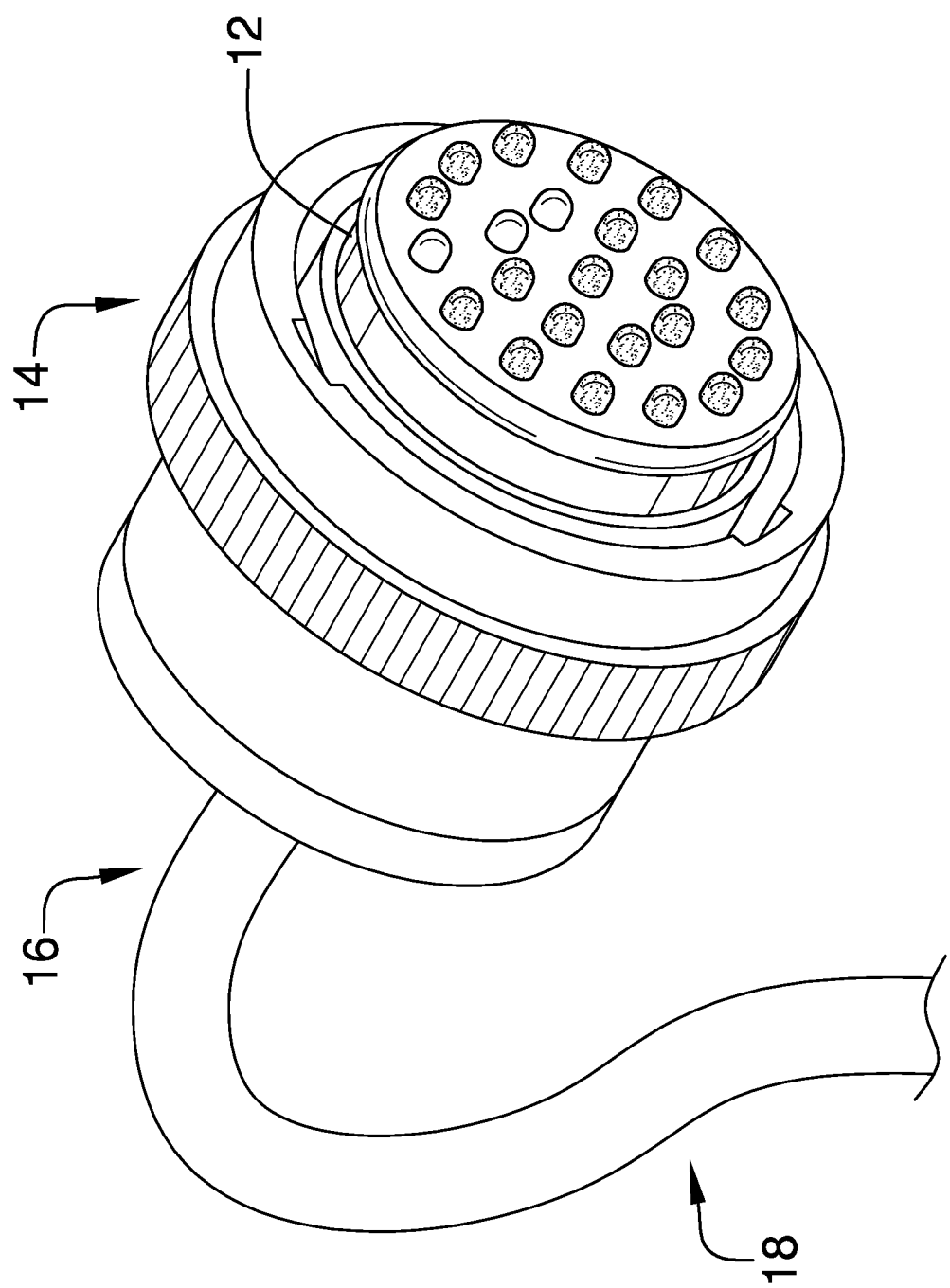
FIG. 5 is a perspective in-use view of an embodiment of the disclosure showing testing lights either being turned on or turned off.

As is most clearly shown in FIG. 3, each of the holes 24 has a first portion 56, a second portion 58 and a third portion 60. The first portion 56 has a diameter that is greater than the second portion 58 for receiving the ledge 44 on the cylinder 36 such that the ledge 44 rests on a threshold 62 between the first portion 56 and the second portion 58. The second portion 58 has a diameter that is greater than the third portion 60 and the second portion 58 receives the cylinder 36. Additionally, the third portion 60 receives the rod 48 and the lower end 40 of the cylinder 36 rests on a threshold 64 between the second portion 58 and the third portion 60.

In use, the puck 12 is placed on the female coupler 14 and testing lights 30 are inserted into respective holes 24 that correspond to locations of sockets 26 in the female coupler 14. Each of the testing lights 30 is turned on if the wire 34 that is associated with the socket 26 in which each testing light 30 is placed is conducting electricity. Additionally, each of the testing lights 30 that are not turned on indicates that the wire 34 associated with the socket 26 in which the testing lights 30 are not turned on is faulty. In this way the entire wiring harness 16 can be quickly diagnosed for faulty wiring as opposed to testing each socket 26 individually with a multi-meter or other type of wire testing device.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A wiring harness testing assembly for testing individual conductors in a wiring harness, said assembly comprising:
    a puck being positionable on a female coupler of a wiring harness on a semi-truck, said puck being foraminous;
    a plurality of testing lights, each of said testing lights having a contact, said contact on each of said testing lights being insertable through a respective foramen in said puck thereby facilitating said contact on each of said testing lights to electrically engage the female coupler of the wiring harness when said puck is positioned on the female coupler, respective ones of said testing lights being turned on when said contact on said respective testing light completes a circuit with a respective wire on the wiring harness thereby facilitating the respective wire to be tested for continuity;
    wherein said puck has a top surface, a bottom surface and a perimeter surface extending between said top surface and said bottom surface, said puck having a plurality of holes each extending through said top surface and said bottom surface thereby facilitating said puck to be foraminous, said holes being spaced apart from each other and being strategically distributed on said puck such that each of said holes is aligned with a respective one of a plurality of sockets in the female coupler when said puck is positioned on the female coupler;
    wherein said puck has a lip extending outward from said perimeter surface of said puck, said lip extending around a full circumference of said perimeter surface, said lip being aligned with said top surface, said lip abutting an upper edge of the female coupler when said puck is positioned on the female coupler; and
    wherein an intersection between said perimeter surface and said bottom surface is chamfered.

2. The assembly according to claim 1, wherein:
said puck has a top surface and a plurality of holes each extending through said puck; and
each of said testing lights comprises a cylinder having an upper end, a lower end and an exterior surface extending between said upper end and said lower end, said cylinder having a ledge extending outwardly from said exterior surface, said ledge being aligned with said upper end, said cylinder extending into a respective one of said holes in said puck having said ledge resting in said puck.

3. The assembly according to claim 2, wherein each of said testing lights includes a light emitter being attached to said upper end of said cylinder such that said light emitters is exposed when said cylinder is inserted into said respective hole.

4. A wiring harness testing assembly for testing individual conductors in a wiring harness, said assembly comprising:
a puck being positionable on a female coupler of a wiring harness on a semi-truck, said puck being foraminous;
a plurality of testing lights, each of said testing lights having a contact, said contact on each of said testing lights being insertable through a respective foramen in said puck thereby facilitating said contact on each of said testing lights to electrically engage the female coupler of the wiring harness when said puck is positioned on the female coupler, respective ones of said testing lights being turned on when said contact on said respective testing light completes a circuit with a respective wire on the wiring harness thereby facilitating the respective wire to be tested for continuity;
wherein said puck has a top surface and a plurality of holes each extending through said puck;
wherein each of said testing lights comprises a cylinder having an upper end, a lower end and an exterior surface extending between said upper end and said lower end, said cylinder having a ledge extending outwardly from said exterior surface, said ledge being aligned with said upper end, said cylinder extending into a respective one of said holes in said puck having said ledge resting in said puck;
wherein each of said testing lights includes a light emitter being attached to said upper end of said cylinder such that said light emitters is exposed when said cylinder is inserted into said respective hole; and
wherein each of said testing lights includes a rod having a top end and a bottom end, said rod extending through said lower end of said cylinder such that said top end is electrically coupled to said light emitter, said rod being elongated between said top end and said bottom end thereby facilitating said rod to extend substantially into a respective socket in the female coupler, said rod being comprised of an electrically conductive material thereby facilitating said light emitter to be in electrical communication with the wire associated with the respective socket.

5. The wiring harness testing assembly according to claim 1, further comprising:
each of said testing lights comprising:
a cylinder having an upper end, a lower end and an exterior surface extending between said upper end and said lower end, said cylinder having a ledge extending outwardly from said exterior surface, said ledge being aligned with said upper end, said cylinder extending into a respective one of said holes in said puck having said ledge resting in said puck;
a light emitter being attached to said upper end of said cylinder such that said light emitters is exposed when said cylinder is inserted into said respective hole; and
a rod having a top end and a bottom end, said rod extending through said lower end of said cylinder such that said top end is electrically coupled to said light emitter, said rod being elongated between said top end and said bottom end thereby facilitating said rod to extend substantially into a respective socket in the female coupler, said rod being comprised of an electrically conductive material thereby facilitating said light emitter to be in electrical communication with the wire associated with the respective socket.

6. A wiring harness testing system for testing individual conductors in a wiring harness, said system comprising:
a semi-truck having a wiring harness being electrically coupled to an ignition control computer in said semi-truck, said wiring harness having a female coupler;
a puck being positionable on said female coupler of said wiring harness, said puck being foraminous, said puck having a top surface, a bottom surface and a perimeter surface extending between said top surface and said bottom surface, said puck having a plurality of holes each extending through said top surface and said bottom surface thereby facilitating said puck to be foraminous, said holes being spaced apart from each other and being strategically distributed on said puck such that each of said holes is aligned with a respective one of a plurality of sockets in said female coupler when said puck is positioned on said female coupler, said puck having a lip extending outwardly from said perimeter surface of said puck, said lip extending around a full circumference of said perimeter surface, said lip being aligned with said top surface, said lip abutting an upper edge of said female coupler when said puck is positioned on said female coupler, an intersection between said perimeter surface and said bottom surface being chamfered; and
a plurality of testing lights, each of said testing lights having a contact, said contact on each of said testing lights being insertable through a respective foramen in said puck thereby facilitating said contact on each of said testing lights to electrically engage said female coupler of said wiring harness when said puck is positioned on said female coupler, respective ones of said testing lights being turned on when said contact on said respective testing light completes a circuit with a respective wire in said wiring harness thereby facilitating said respective wire to be tested for continuity, each of said testing lights comprising:
a cylinder having an upper end, a lower end and an exterior surface extending between said upper end and said lower end, said cylinder having a ledge extending outwardly from said exterior surface, said ledge being aligned with said upper end, said cylinder extending into a respective one of said holes in said puck having said ledge resting in said puck;
a light emitter being attached to said upper end of said cylinder such that said light emitters is exposed when said cylinder is inserted into said respective hole; and
a rod having a top end and a bottom end, said rod extending through said lower end of said cylinder such that said top end is electrically coupled to said light, emitter such that said rod defines said contact, said rod being elongated between said top end and said bottom end thereby facilitating said rod to extend substantially into a respective socket in said female coupler, said rod being comprised of an electrically conductive material thereby facilitating said light emitter to be in electrical communication with said wire associated with said respective socket.

\* \* \* \* \*